United States Patent
Milic-Strkalj et al.

[11] Patent Number: 6,096,586
[45] Date of Patent: Aug. 1, 2000

[54] MOS DEVICE WITH SELF-COMPENSATING $V_{AT}$-IMPLANTS

[75] Inventors: Ognjen Milic-Strkalj, Burlingame; Geoffrey Choh-Fei Yeap, Sunnyvale, both of Calif.

[73] Assignee: Advanced Micro Devices, Inc., Sunnyvale, Calif.

[21] Appl. No.: 08/949,959

[22] Filed: Oct. 14, 1997

[51] Int. Cl.[7] .................. H01L 29/76; H01L 21/8238; H01L 21/336; H01L 21/8249
[52] U.S. Cl. .................. 438/174; 438/217; 438/290; 438/525; 438/230; 257/402
[58] Field of Search .................. 257/336, 344, 257/345, 404; 438/174, 217, 230, 231, 232, 289, 290, 291

[56] References Cited

U.S. PATENT DOCUMENTS

| | | | |
|---|---|---|---|
| 5,091,763 | 2/1992 | Sanchez | 357/23.9 |
| 5,843,825 | 12/1998 | Hwang | 438/291 |
| 5,844,276 | 12/1998 | Fulford, Jr. et al. | 257/336 |
| 5,847,428 | 12/1998 | Fulford, Jr. et al. | 257/344 |

OTHER PUBLICATIONS

"Source–to–Drain Nonuniformly Doped Channel (NUDC) MOSFET Sturctures for High Current Drivability and Threshold Voltage Controllability", Okumura et al., IEEE Transaction on Electron Devices, vol. 39, No. 11, Nov. 1992, pp. 2541–2552.

S. Wolf and R.N. Tauber, Silicon Processing for the VLSI Era, vol. 1, Lattice Press, pp. 303–308 and 242–256, 1986.

*Primary Examiner*—Olik Chaudhuri
*Assistant Examiner*—S. H. Rao
*Attorney, Agent, or Firm*—Davis Chin

[57] ABSTRACT

There is provided a MOS device with self-compensating threshold implant regions and a method of manufacturing the same which includes a semiconductor substrate, a partial first threshold implant forming a higher concentration layer, a gate oxide formed on the surface of the higher concentration layer, and a gate formed on a surface of the gate oxide. The MOS device further includes a second threshold implant for forming self-compensating implant regions in the substrate which is subsequently heated to define pockets. A third implant is performed to create lightly-doped source/drain regions. A sidewall spacer is formed on each side of the gate. A fourth implant is performed to create highly-doped source/drain regions between the lightly-doped source/drain regions and the pockets.

4 Claims, 3 Drawing Sheets

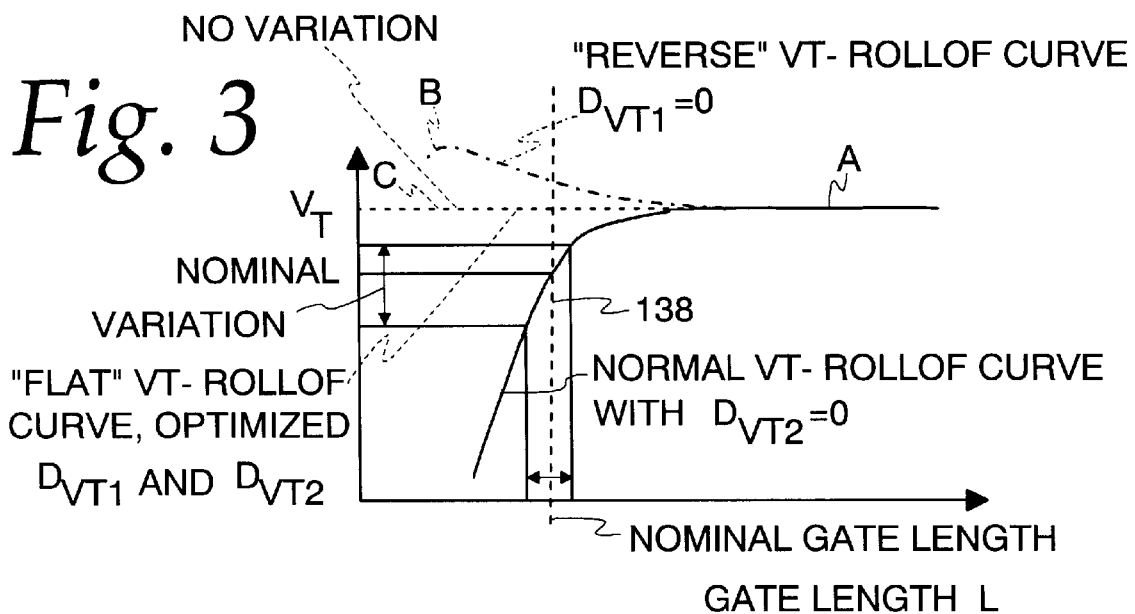
Fig. 3
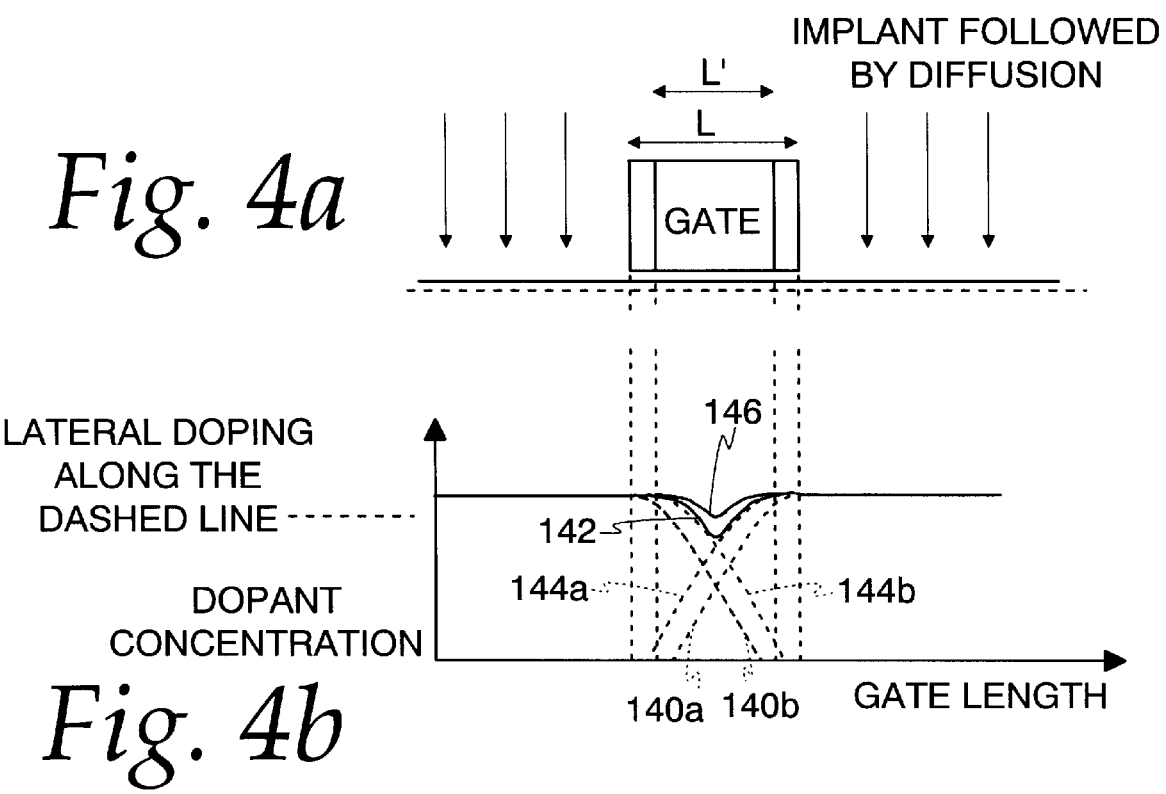
Fig. 4a
Fig. 4b

MOS DEVICE WITH SELF-COMPENSATING $V_{AT}$-IMPLANTS

BACKGROUND OF THE INVENTION

1. Field of the Invention

This invention relates generally to a semiconductor device and a method of manufacturing the same and more particularly, it relates to an improvement of a method of manufacturing a metal oxide semiconductor (MOS) device which includes self-compensating threshold adjust implants.

2. Description of the Prior Art

As is generally well-known in the art, a semiconductor device having a stacked structure of metal insulator-semiconductor is referred to as a MIS semiconductor device. A transistor which uses an oxide film as the insulator is referred to as MOSFET (Metal Oxide Semiconductor Field Effect Transistor). A typical MOSFET structure includes a pair of source/drain regions (n-type for an N-MOSFET or p-type for a P-MOSFET) formed on a surface of a silicon substrate, a gate oxide film formed on the substrate between the source/drain regions, and a gate electrode formed on the surface of the gate oxide film. The surface area of the substrate between the source region and the drain region is defined as a channel region. The length of the channel region is the distance between the source/drain regions which is typically somewhat shorter than the gate length.

The threshold voltage $V_T$ for the MOSFET device is defined to be the gate-to-source $V_{gs}$ applied across the gate and source electrodes, below which the MOS device drain-to-source current $I_{ds}$ becomes near zero. However, this threshold voltage is a function of a number of parameters, which includes the gate material, the gate insulation material, the gate insulation thickness, the channel doping, the impurities at the silicon-insulator interface, and the source-to-substrate voltage between the source and the substrate.

In order to increase the speed of the MOS device, there exists a continuing trend of scaling-down the structure to smaller sizes. One of the ways of scaling is by reducing the length of the gate. However, one of the most pronounced effects occurs due to the gate length reduction is the loss of gate electrode control which is sometimes referred to as threshold ($V_T$) roll-off. Therefore, in the classical VLSI and integrated circuit design where a very large number of MOSFET devices are fabricated on a plurality of semiconductor integrated circuit dies or chips on a wafer, the distribution of the actual gate length across the wafer will vary due to inescapable process variations. Since the threshold voltage is a function of the gate length, this will also cause the threshold voltages of the various MOS devices on the wafer to be subjected to a wide degree of fluctuation. As a result, the yield for such MOS devices during production will be greatly reduced.

There are known techniques for threshold adjusts which exist in the prior art. For example, in an article entitled "A Novel Source-to-Drain Nonuniformly Doped Channel (NUDC) MOSFET for High Current Drivability and Threshold Voltage Controllability" and authored by Y. Okumura et al., IDEM 90, pp. 391–394, there is described a method of a MOSFET fabrication where the concentration of the channel near the source and drain is increased to suppress the widening of the depletion region and the concentration in the middle of the channel is decreased so as to increase the mobility.

In U.S. Pat. No. 5,466,957 issued on Nov. 14, 1995, to Yuki et al., there is disclosed a semiconductor device which includes a substrate of a first conductivity type, a gate electrode laminated thereon, and source/drain regions of a second conductivity type formed in a self-aligned manner in an upper portion of the substrate outside the gate electrode. A high concentration layer of the first conductivity type is formed in a channel region between the source and drain regions. A low conductivity layer of the first conductivity type is formed between the high conductivity layer and the source/drain regions.

There is also known in the prior art of a technique for controlling the threshold distribution by threshold adjust implant (channel doping at the silicon-insulation interface) prior to the deposition of the gate polysilicon. This classical threshold adjust implant method is described hereinbelow with reference to the fabrication steps shown in FIGS. 1(a) through FIG. 1(f) and labeled as "Prior Art."

In FIG. 1(a), there is illustrated a silicon substrate material 10 which may be of a first conductivity type, in which a threshold adjust implant represented by the solid vertical lines 12 penetrate into the substrate material 10 at an incidence angle of 7° so as to form a higher concentration layer 10a of the first conductivity type. For an NMOS device, the impurity is of the same first conductivity type such as boron (B) or $BF_2$ while for a PMOS device the impurity is arsenic (As) or phosphorus (P). Typically, the impurity is doped in a dose of approximately $8 \times 10^{12}$ ions/$cm^2$ and at an energy of 5–15 KeV. Then, a gate oxide 14 is grown on the surface of the substrate material 10 having the threshold adjust implant 10a, as shown in FIG. 1(b). Next, a gate electrode 16 comprising polysilicon is deposited on the substrate material 10 over the gate oxide 14 and is patterned using conventional photolithography techniques followed by an anisotropic dry etching, as depicted in FIG. 1(c).

Thereafter, lightly-doped source/drain (LDD) regions 18 with low concentration are implanted at a self-aligning position with the gate electrode 16 on the silicon substrate 10 of the first conductivity type, as shown in FIG. 1(d). For the NMOS device, the impurity is of a second conductivity type such as arsenic ions 19 which are implanted in a dose of $1 \times 10^{14}$ to $1 \times 10^{15}$ ions/$cm^2$, at 5 KeV, and an incidence angle of 0° to 7°. After the LDD implant, sidewall spacers 20 serving as insulating films are formed on each side of the gate electrode 16 by etching, as shown in FIG. 1(e). Finally, highly-doped source-drain regions 22 with higher concentration are implanted between LDD regions 18 and the higher concentration layer 10a at self-aligning position with the sidewall spacers 20, as illustrated in FIG. 1(f). For the NMOS device, the impurity is of the second conductivity type, such as arsenic ions 23, which are implanted in a dose of about $2 \times 10^{15}$ ions/$cm^2$, at 5–10 KeV, and an incidence angle of 0° to 7°.

Generally, the prior art techniques for threshold adjust suffer from the disadvantages of requiring high energy and high-tilt angle implants. Accordingly, there still exists a need for a method for fabricating MOS devices which have a minimal threshold fluctuation across the semiconductor wafer so as to improve its yield, but yet permits the ability to use low energy and low-tilt angle implants.

The present invention represents a significant improvement over the prior art threshold techniques which provides a method for fabricating MOS devices with an improved threshold roll-off curve. This is achieved in the instant invention by performing an additional threshold adjust implant after the gate is deposited, patterned and etched.

SUMMARY OF THE INVENTION

Accordingly, it is a general object of the present invention to provide an improved method of manufacturing a MOS device which includes self-compensating threshold adjust implants.

It is an object of the present invention to provide a method for fabricating MOS devices which has a minimal threshold fluctuation across the semiconductor wafers so as to improve its yield.

It is another object of the present invention to provide a method for fabricating MOS devices which utilizes low energy and low-tilt angle implants.

It is still another object of the present invention to provide a method for fabricating MOS devices which allows tracking automatically of channel doping in the substrate so as to increase and decrease the doping as the gate length is varied.

It is yet still another object of the present invention to provide a method for fabricating MOS devices which has an improved threshold roll-off curve that can be adjusted to have a desired slope.

In accordance with a preferred embodiment of the present invention, there is provided a MOS device having self-compensating threshold adjust implants and a method of fabricating the same. A semiconductor substrate of a first conductivity type is provided. A partial first threshold implant of dopant of the first conductivity type is performed so as to form a higher concentration layer on the semiconductor substrate. A gate oxide is formed on the surface of the higher concentration layer, and a gate is formed on the surface of the gate oxide.

A second threshold implant of dopant of the first conductivity type is performed so as to form self-compensating implant regions in the higher concentration layer on opposite sides of the gate. The substrate with self-compensating implant regions is then heated so as to cause lateral diffusion in the highly conductive layer and under the gate to define pockets. A third implant of a second conductivity type is performed so as to create lightly-doped source/drain regions in the self-compensating implant regions on opposite sides of the gate. A sidewall spacer is formed on each side of the gate. Finally, a fourth implant of the second conductivity type is performed so as to create highly-doped source/drain regions between the lightly-doped source/drain regions and the self-compensating implant regions.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 are graphs of threshold roll-off curves with the threshold voltage $V_T$ plotted as a function of the gate length L;

FIG. 4(a) is a graphical representation of two devices having different gate lengths in which the self-compensating threshold implant step of the present invention is applied; and FIG. 4(b) is a graph of dopant concentration in the channel region of the MOS devices of FIG. 4(a), resulting from the self-compensating step.

DESCRIPTION OF THE PREFERRED EMBODIMENT

In accordance with the principles of the present invention, a method of manufacturing a MOS device having self-compensating threshold adjust implants is provided. The present invention will now be described in detail with reference to the accompanying drawings. It should be appreciated that the drawings are in greatly simplified form. In practice, the MOS device will be one of a very large number of semiconductor devices formed on a plurality of semiconductor integrated circuit dies on a wafer in which the various MOS devices may be suitably connected in different circuit arrangements. Further, it should be clearly understood that while there is described the method of manufacture an N-type MOS device (NMOS) the present invention is equally applicable to fabrication of opposite conductivity type devices (e.g., p-type MOS devices or PMOS).

Figure 1A:
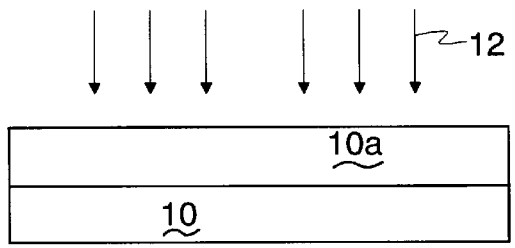
FIGS. 1(a)–1(f) are a series of cross-sectional views, illustrating the classical manufacturing steps for fabricating a semiconductor MOS device.
Figure 1D:
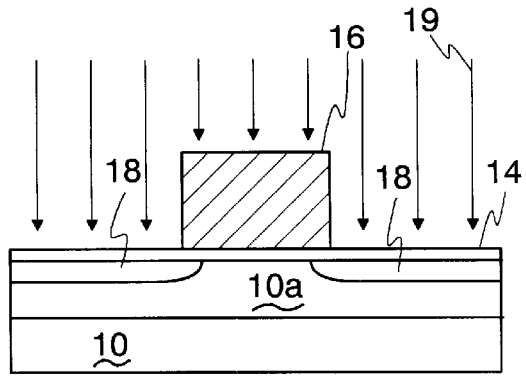
Figure 1B:
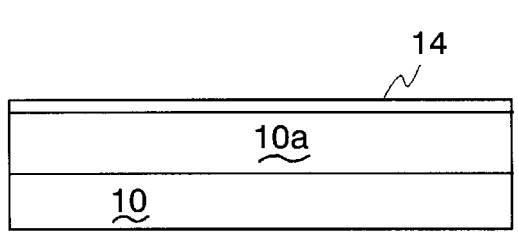
Figure 1E:
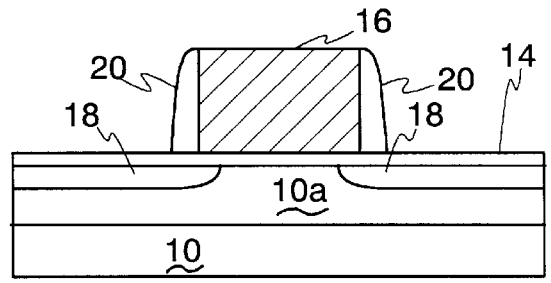
Figure 1C:
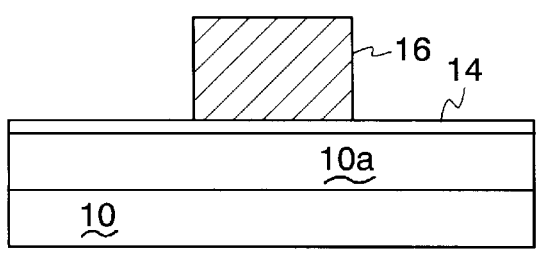
Figure 1F:
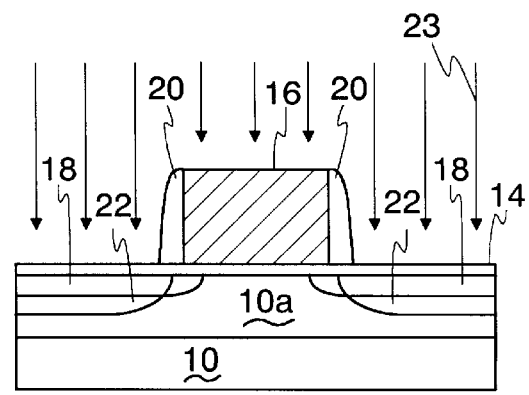
Figure 2A:
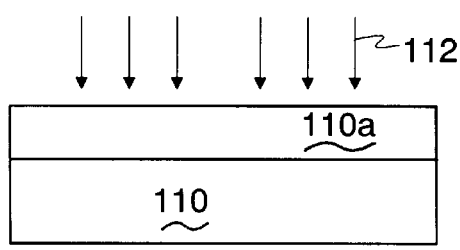
FIGS. 2(a)–2(h) are a series of cross-sectional views, illustrating the manufacturing steps for a semiconductor MOS device with self-compensating threshold implants in accordance with the principles of the present invention.

With particular reference to FIGS. 2(a) through 2(h), there are illustrated the manufacturing steps for fabricating an NMOS device with self-compensating threshold adjust implants, according to the present invention. In FIG. 2(a), there is shown a first conductivity type or p-type silicon substrate 110 in which a partial first threshold adjust implant represented by the solid vertical lines 112 penetrates into the silicon substrate 110 so as to form a higher concentration p-type layer 110a on the p-type silicon substrate. Preferably, boron ions are used as the impurity which are implanted at an incidence angle of 7° in a dose of about $2 \times 10^{12}$ to $4 \times 10^{12}$ ions/cm$^2$ and at an energy level of 5–15 KeV. It will be noted that this dose is smaller than the one used in the classical $V_T$ implant of FIG. 1(a) since the fraction of its dose will be added to the subsequent self-compensating implant.

Figure 2B:
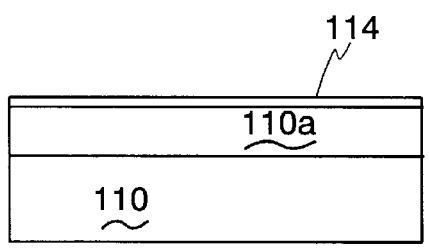
Figure 2C:
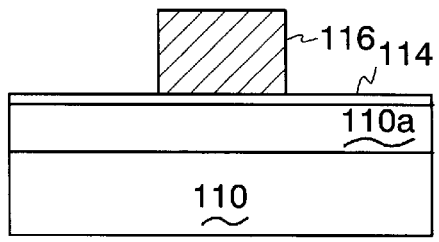

Then, as shown in FIG. 2(b), a gate oxide 114 in a thickness of approximately 30 Å is formed on the higher concentration layer 110a by thermal oxidation at about 800° C. Thereafter, a layer 116 of polysilicon is grown thereon in a thickness of approximately 1500 Å by a chemical vapor deposition (CVD) process. Sequentially, the polysilicon layer 116 is subjected to well-known photolithography and etching process in order to form a gate electrode on the gate oxide. This is depicted in FIG. 2(c). It should be apparent to those skilled in the art that after the gate etch the remaining gate oxide 114 not covered by the gate electrode 116 may also be etched and a new oxide is then grown which oxidizes the gate electrode as well. This new oxide thus formed is typically somewhat thicker than the gate oxide 114.

Figure 2D:
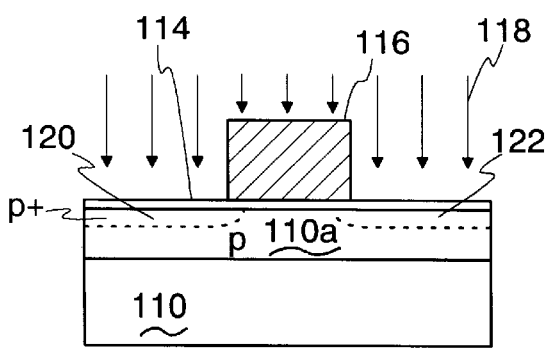

Next, a second threshold adjust implant represented by the solid vertical lines 118 penetrates into the higher concentration layer 110a to form p$^+$ implant regions 120 and 122, as illustrated in FIG. 2(d). The impurity ions may be boron or BF$_2$ and is implanted at a dose of approximately $1 \times 10^{13}$ to $8 \times 10^{13}$ ions/cm$^2$ at an energy, which is not smaller than that which is sufficient to introduce significant fraction of the total dose into the silicon substrate and which is not excessively high so as to avoid a peak doping too far below the surface of the substrate, such as of about 2–5 KeV, as illustrated in FIG. 2(d). Preferably, the dose is about $5 \times 10^{13}$ ions/cm$^2$. The tilt angle is also preferably in the range between 0°–7°. For an incidence angle larger than 0°, the wafer is preferably rotated during the implant to avoid a beam shadowing effect produced by the gate. It will be noted that unlike the prior art techniques, the self-compensating implant is performed after the gate is deposited, patterned and etched, without utilizing high-tilt angle and high energies. In this manner, the peak of the lateral doping is maintained relatively close to the surface of the silicon substrate.

Figure 2E:
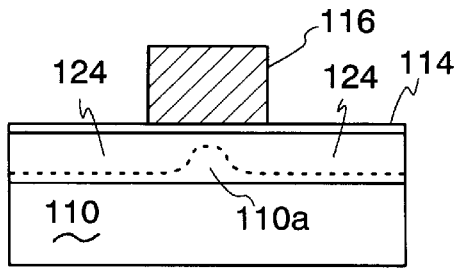
Figure 2F:
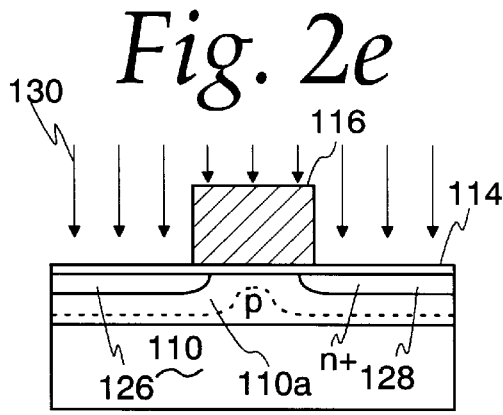

Thereafter, a rapid thermal annealing (RTA) process is optionally performed in order to activate the implanted regions 120, 122 in the substrate so as to diffuse laterally the dopant therein to create "pockets" 124 from each side of the gate in which source/drain regions will be subsequently formed. This is illustrated in FIG. 2(e). The silicon substrate with the implanted regions 120, 122 is preferably heated for a time period of 10 to 60 seconds and at a temperature between 900° C. to 1050° C. Alternatively, a low temperature furnace anneal may be performed at 700–850° C. for 5–15 minutes. In this fashion, the dopant is driven underneath the gate area and the peak concentration of the dopant in the source/drain region will be lowered. The lateral doping slope of the self-compensating regions 120, 122 and subsequently annealed doping profile will cause the channel doping level to change.

Figure 2G:
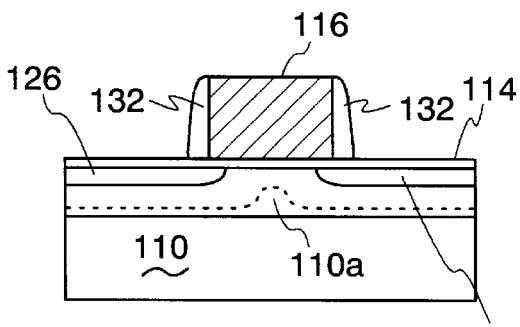
Figure 2H:
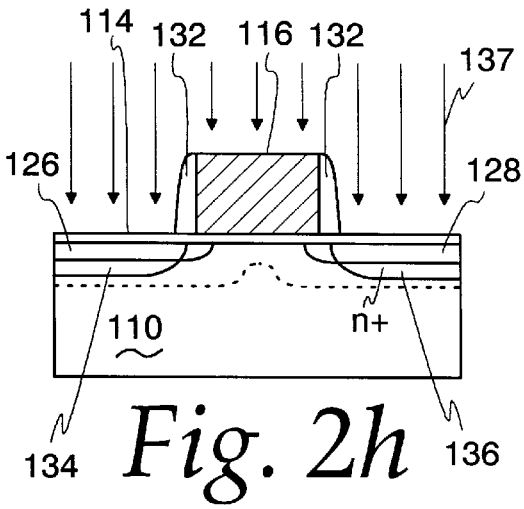

Then, lightly doped source/drain (LDD) regions 126 and 128 with low concentration are implanted at a self-aligning position with the gate electrode and in the self-compensating regions 120, 122 defining the respective pockets 124 on each side of the gate. The impurity ion is of a second conductivity type such as arsenic ions 130 and is implanted in a dose of $5 \times 10^{14}$ to $1 \times 10^{15}$ ions/cm$^2$, at 5 KeV and an incidence angle of 0°. Next, sidewall spacers 132 serving as insulating films are grown on each side of the gate electrode 116 by a CVD process and are subsequently etched. This is shown in FIG. 2(g). Finally, highly-doped source/drain regions 134 and 136 with high concentration are implanted between the LDD regions 126, 128 and the self-compensating regions 120, 122 defining the pockets 124 at self-aligning position with the sidewall spacers 132, as illustrated in FIG. 2(h). The impurity is of the second conductivity type such as arsenic ions 137, which are implanted in a dose of about $2 \times 10^{15}$ ions/cm$^2$ at 5–10 KeV and an incidence angle of 0° to 7°. It should be understood that a second RTA process may be performed for a time period of 10 to 60 seconds and at a temperature between 900° C. to 1050° C. to activate the highly-doped source/drain regions 130, 136.

Alternatively, the first threshold ($V_T$) implant of FIG. 2(a) may be eliminated entirely. In FIG. 3 there are shown graphs of threshold roll-off curves, illustrating the threshold voltage $V_T$ as a function of the gate length L. The solid line of curve A is the normal threshold roll-off curve with the conventional process of FIG. 1(a) when no self-compensating implant regions of the present invention are performed.

As can be seen, the vertical dotted line 138 represents the location of a nominal gate length with the double arrows indicating fluctuation due to process variations. Thus, in the conventional process the scaling-down of the gate length L will cause an undesired lowering of the threshold voltage $V_T$ along the curve A. If the first $V_T$ implant of FIG. 2(a) is not performed, then the dot-dash curve B will be obtained with a maximum negative slope or reverse threshold roll-off curve. By selecting properly the doses for the first threshold implant of FIG. 2(a) and the self-compensating implant of FIG. 2(f), the dash curve C will be achieved with a flat threshold roll-off curve. Thus, the present invention allows fabrication of MOS devices to have a threshold roll-off curve which can be "tailored," with any slope, positive or negative by balancing the implant doses of the first and second implants. Further, the present invention provides a MOS device which has improved saturation current $I_{SAT}$ characteristics as well as reduced drain and source capacitances thereby rendering faster switching speeds.

In FIG. 4(a), there is shown a graphical representation of two MOS devices having different gate lengths (L<L') in which the self-compensating implant step of the present invention is applied. Since the MOS device having the shorter gate length L' will have a lower threshold (see FIG. 3), the present invention serves to change or raise its threshold voltage $V_T$ so as to match the MOS device having the longer gate length L by increasing the doping in the channel area. As a result, the MOS device with the shorter gate length L' will have more channel doping while the MOS device with the longer gate length L will have less channel doping so as to minimize the $V_T$ fluctuation shown in FIG. 3.

The present invention allows tracking automatically of the channel doping of the MOS device as a gate length is varied due to process variations. In other words, the shorter gate length device will be compensated in terms of the threshold voltage by the addition of doping into the channel. The present invention is achieved automatically since the channel doping tracks the gate length. This result can be best understood by reference to FIG. 4(b) which is a graph of the dopant concentration in the channel region of the two MOS devices of FIG. 4(a). The curves 140a and 140b are the two lateral doping profiles for the MOS device having the longer gate length L, and the curve 142 is its resultant profile obtained by addition of the curves 140a and 140b. Similarly, the curves 144a and 144b are the two lateral doping profiles for the MOS device having the shorter gate length L', and the curve 146 is its resultant profile obtained by addition of the curves 144a and 144b. By comparing the curve 146 with the curve 142, it can be observed that the channel doping profile for the shorter gate length L' is higher than the one for the longer gate length L, thereby maintaining the threshold voltage $V_T$ substantially the same.

From the foregoing detailed description, it can thus be seen that the present invention provides a MOS device with self-compensating threshold adjust implants and a method of manufacturing the same. This is achieved by a second threshold implant performed after the gate has been deposited, patterned and etched. As a result, the lateral slope of the second threshold implant and subsequently annealed doping profile will change the channel doping level so as to automatically track the gate length. The present invention does not use high energy and large-tilt angle implants.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of fabricating a MOS device having self-compensating implant regions, said method comprising the steps of:

providing a semiconductor substrate of a first conductivity type;

performing a partial first threshold implant of dopant pf the first conductivity type at a dose between about $2 \times 10^{12}$ and $4 \times 10^{12}$ ions/cm$^2$ and at an energy about 5–15 KeV with a low tilt angle of 7° so as to form a higher concentration layer on said semiconductor substrate which is higher than said substrate;

forming a gate oxide on a surface of said higher concentration layer;

forming a gate on a surface of said gate oxide;

performing subsequent to the gate formation a second threshold adjust implant of dopant of the first conductivity type at a dose of about $1\times10^{13}$ and $8\times10^{13}$ ions/cm$^2$ and at an energy about 2–5 KeV with a low tilt angle of 0°–7° so as to form self compensating implant regions in said higher concentration layer on opposite sides of said gate;

said self-compensating implant regions creating a lateral non-uniform channel doping which compensates for variations in the length of the gate;

heating subsequent to the second threshold adjust implant said substrate with self-compensating implant regions so as to cause lateral diffusion in said higher concentration layer and under said gate to define pockets from each side of the gate in which source/drain regions will be subsequently formed;

said heating being used to control the level of the lateral non-uniform channel doping so as to compensate for the variations in the length of the gate; performing a third implant of a second conductivity type so as to create lightly-doped source/drain regions in said pockets on opposite sides of said gate;

forming a sidewall spacer on each side of said gate; and performing a fourth implant of the second conductivity type through said gate and said gate oxide so as to create highly-doped source/drain regions between said lightly-doped source/drain regions and said pockets.

2. A method of fabricating a MOS device as claimed in claim 1, wherein said first conductivity type is a p-type and wherein said second conductivity type is an n-type.

3. A method of fabricating a MOS device as claimed in claim 1, wherein said step of heating includes rapid thermal annealing of said substrate for a period of 10 to 60 seconds and at a temperature between 900°–1050° C.

4. A method of fabricating a MOS device as claimed in claim 2, wherein said p-type is boron, and wherein said n-type is arsenic.

* * * * *

UNITED STATES PATENT AND TRADEMARK OFFICE
CERTIFICATE OF CORRECTION

PATENT NO : 6,096,586
DATED : August 1, 2000
INVENTOR(S): Ognjen Milic-Strkalj et al.

It is certified that error appears in the above-identified patent and that said Letters Patent are hereby corrected as shown below:

Column 5, line 13, delete "35".

Signed and Sealed this

Twenty-second Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO. : 6,096,586
DATED : August 1, 2000
INVENTOR(S) : Ognjen Milic-Strkalj et al.

It is certified that error appears in the above-identified patent and that said Letters Patent is hereby corrected as shown below:

Column 5,
Line 13, delete "35".

Signed and Sealed this

Nineteenth Day of October, 2004

JON W. DUDAS
*Director of the United States Patent and Trademark Office*